United States Patent [19]
Pollmeier

[11] 3,932,769
[45] Jan. 13, 1976

[54] CIRCUIT ARRANGEMENT FOR PRODUCING A DEFINED LOGIC CONDITION, PARTICULARLY FOR THE MONITORING SIGNAL OUTPUT IN DATA PROCESSING EQUIPMENT

[75] Inventor: Werner Pollmeier, Verl, Germany

[73] Assignee: Nixdorf Computer AG, Paderborn, Germany

[22] Filed: June 17, 1974

[21] Appl. No.: 480,151

[30] Foreign Application Priority Data
June 18, 1973   Germany............................ 2330969

[52] U.S. Cl.............. 307/252 G; 307/255; 307/288
[51] Int. Cl.² ........................................ H03K 17/72
[58] Field of Search ....... 307/255, 252 G, 288, 313, 307/284, 305

[56] References Cited
UNITED STATES PATENTS

| | | | |
|---|---|---|---|
| 3,500,370 | 3/1970 | Rasiel et al. ........................ | 307/288 |
| 3,526,788 | 9/1970 | Stover et al. ....................... | 307/313 |
| 3,551,701 | 12/1970 | Carlson ............................. | 307/252 G |
| 3,582,665 | 6/1971 | Prozeller ........................... | 307/255 |
| 3,619,656 | 11/1971 | Domke .............................. | 307/255 |

OTHER PUBLICATIONS

"Silicon Controlled Switches", R. A. Stasior Applic. Note GE, 90.16, p. 26, June 1964.

Primary Examiner—John Kominski
Attorney, Agent, or Firm—Woodhams, Blanchard and Flynn

[57]  ABSTRACT

A circuit arrangement in a line which transfers a condition by means of a semiconductor switching arrangement which produces a logic condition associated with monitored data processing equipment. The semiconductor switching arrangement has a thyristor characteristic and consists of a pair of transistors which form a control circuit with one of the transistors, particularly the emitter thereof forming the anode point of the semiconductor arrangement. This one transistor is also provided with a base-emitter resistor which is dimensioned corresponding to the sum of the collector-base residual currents of the pair of transistors in the control circuit when the semiconductor switching arrangement is in the blocked or non-conducting condition.

4 Claims, 1 Drawing Figure

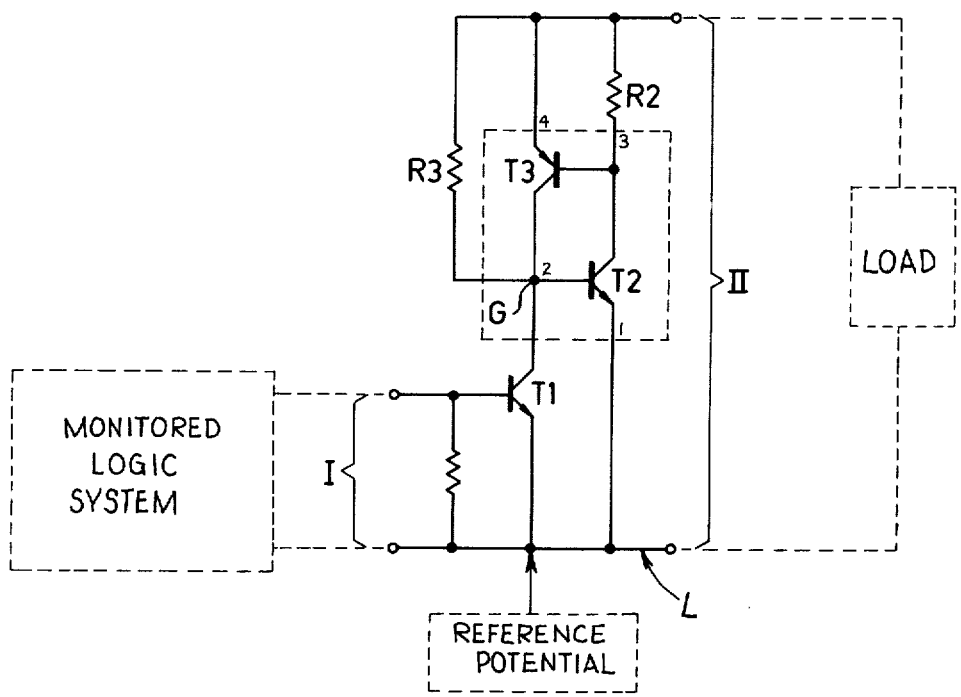

CIRCUIT ARRANGEMENT FOR PRODUCING A DEFINED LOGIC CONDITION, PARTICULARLY FOR THE MONITORING SIGNAL OUTPUT IN DATA PROCESSING EQUIPMENT

FIELD OF THE INVENTION

The invention relates to a circuit arrangement for producing a defined logic condition on a line which transfers this condition by means of semiconductor switches for the purpose of characterizing a logic condition which is to be monitored, particularly for the monitoring signal output in data processing equipment.

BACKGROUND OF THE INVENTION

A circuit arrangement of this type is particularly required in digitally operating devices in order to deliver a monitoring signal which is used as a switch-off criteria for such devices which may be controlled only through defined logic conditions. If, for example, the operating voltage varies in data processing equipment, logic conditions which are defined below a pregiven nominal operating voltage cannot be maintained in the individual operating units. Output equipment, which are controlled by such a disturbed logic condition, can generate undefined outputs and thus give false data. It is, for example, possible to operate in an uncontrolled manner a recording instrument or also a core storage device whereby the stored information is possibly destroyed.

If digital operating units of data processing equipment, which units interact with one another, are fed through several supply voltages, it is possible, aside from the described power-supply voltage variations, during switching off or switching on of the current supply net for the individual supply voltages to drop off with different time constants or to reach their nominal value. Thus, the case may occur that an operating unit receives its full supply voltage, however, is controlled by a different operating unit with an undefined variable digital input.

Thus, it is necessary to produce as quickly as possible a characterizing signal for operations of the described type which cause errors and to thus characterize the logic condition which is to be monitored, thus, for example, the voltage condition of a current supply device at a pregiven deviation. The signal is to deliver a fixed pregiven logic condition which is independent from an operating voltage and reliably assures the switching off of faultily operating or faultily controlled operating units.

Within data processing equipment such a characterizing signal is produced on a special signal line. Same could, for example, consist of a chain circuit of switches which are each associated with an operating unit or current supply unit and are closed when the respective orderly function exists. When a faulty mode of operation occurs in one of the monitored devices, the switch which is associated with it would be opened and the entire chain circuit would become currentless so that therewith simultaneously a criteria which characterizes the faulty condition of a device would be produced. However, the use of a chain circuit has the disadvantage that a change of a unit, for example, the removal of or the additional insertion of a device which is to be monitored, always results in electrical and structural changes of the described chain circuit.

The purpose of the invention is to produce a circuit arrangement for producing a defined logic condition, which is fed alone through the logic system which must be monitored and thus operates without any special or separate operating voltage. The circuit arrangement furthermore permits a simple signal output which requires no changes of the electrical or structural type when changes occur in the entire monitored unit.

A circuit arrangement of the above-named type is constructed inventively to attain this purpose in such a manner that the condition which is to be monitored is connected to the control path of a switch device which is conductively controlled therethrough, the switch path of the switch device being connected into a control circuit of a semiconductor arrangement having thyristor characteristics, which semiconductor arrangement emits the defined condition at its anode-cathode path, and that the anode point of this semiconductor arrangement is connected to its control electrode through an ohmic resistor.

This circuit arrangment operates without any operating voltage and can be connected through only two different logic conditions which appear at its control input and if the control current does not exist can carry comparably strong currents. It then produces the criteria $U = 0$ on a signal line. Thus, an arrangement is realized which, independent from a special operating voltage and its variations, is switched alone by the signal controlling it and has thereby a switching characteristic of an inactive contact. The arrangement can therefore be operated together with other similarly operating circuits connected in parallel on one signal line without influencing same through the switching characteristics of the other circuits. Contrary to a pure thyristor circuit, the circuit arrangement of the invention can also be quenched at its control input, for which only the control current must be switched on. A particular advantage of this circuit arrangement consists in that the voltage which is required at its anode-cathode path for carrying out a switching operation can be lowered to values which are paractically equal to the saturation voltage and which drops off from it in the conductive condition. This is due to the fact that through an ohmic resistor, a current flow is possible to the semiconductor element which it does not by-pass and which must be only large enough to start a conducting operation and that this semiconductor element has a current amplification factor which is greater than 1.

A circuit arrangement according to the invention can be associated with a unit which must be monitored with respect to its operation. Thus, the unit may be part of a current supply device or other units of data processing equipment. Several existing conitoned circuits of this type can then be connected in parallel with one another to a common signal line or common main, to which they deliver the defined logic condition which they each produce and the common line can be connected to a control device which effects the switching off of sensitive operating units to undefined input values.

According to a further construction embodied within the scope of the invention, the ohmic resistor is preferably dimensioned corresponding to the voltage which, in conducting condition of the semiconductor arrangement, exists across it and the current which flows during a blocked or nonconductive anode-cathode path of the circuit arrangement flows through the control path of the semiconductor element which is not by-passed by this resistor. In the case of such a dimensioned ohmic resistor, the conducting voltage of the semiconductor arrangement is practically equal to the saturation voltage which in the conductive condition exists across it. The current which is needed for conduction lies for both semiconductor arrangements in the order of magnitude of some microamperes so that a common line which is connected to the anode-cathode path is loaded at a minimum.

SUMMARY OF THE INVENTION

The circuit arrangement according to the invention can advantageously and at the least possible output be constructed in such a manner that the semiconductor arrangement having thyristor characteristics consists of a second transistor which forms the control circuit and a third transistor which with its emitter forms the anode point and that the third transistor is provided with a base-emitter resistor which is dimensioned corresponding with the sum of the collector-base residual currents of the second and the third transistors, which collector-base residual currents flow at a blocked or nonconducting semiconductor arrangement.

With such a construction of the circuit arrangement, the practical correspondence of saturation voltage and conduction voltage can be achieved particularly simply, because the named ohmic resistor and the base-emitter resistor can be adjusted to various transistor types due to their construction separate from the transistors and thus permit a maintaining of the advantages achievable with the invention for practically all outputs of known classes of transistors used.

One exemplary embodiment of a circuit according to the invention will be described hereinafter in association with the single FIGURE in the drawing.

DETAILED DESCRIPTION

The electrical circuit in the drawing illustrates, as an exemplary embodiment, a circuit in which the semiconductor arrangement having thyristor characteristics is realized by the use of two transistors of which the base electrode and the collector electrode are interconnected. Such an arrangement of two transistors is actually known as an equivalent circuit for a thyristor. A thyristor also has the characteristic of a four-layer diode. When the voltage which is applied across its amode-cathode path exceeds a pregiven value, an conducting operation takes place and the anode-cathode path changes into the conducting condition. An conduction current is required on its control electrode at a constant anode-cathode path voltage. Said conduction current is independent from the anode-cathode path voltage and the anode-cathode path current. The quenching operation of a thyristor is caused by lowering the anode-cathode path current to a pregiven value. A quenching through the control electrode would require, if necessary, a control current in the order of magnitude of the respective anode current in the direction which is opposite to the conduction current. Therefore, quenching is usually not carried out in the control circuit.

Differing from this mode of operation of a thyristor or a four-layer diode, a circuit arrangement according to the invention operates in all characteristics practically independent from the anode-cathode path voltage and the anode-cathode current. This is assured in such a manner that additional resistors, which are dimensioned in a certain manner which will yet be described, are associated with the semiconductor arrangement having thyristor characteristics.

The circuit arrangement which is illustrated by the drawing has a pair of input terminals designated by the reference I and a pair of output terminals designated by the reference II. The logic condition which is to be monitored is connected to the input terminals I, the defined logic condition which is produced with the circuit arrangement appears at the output terminals II. The arrangement which is illustrated in the drawing consists of three transistors T1, T2 and T3, of which the transistors T2 and T3 are interconnected according to a thyristor equivalent circuit. This means that the collector of the transistor T2 is connected to the base of the transistor T3 and the collector of the transistor T3 is connected to the base of the transistor T2. Thus one of these connecting points corresponds to the control electrode for the thyristor arrangement formed of the transistors T2 and T3. In the exemplary embodiment illustrated in the drawing, this is the base of the transistor T2 coupled with the collector of the transistor T3. The collector of a controlling transistor T1 is connected to the control electrode point G, the emitter of said transistor T1 and also the emitter of the transistor T2 being connected to a common line L having a predetermined reference potential thereon. The base of the transistor T1 is connected to one of the terminals of the control input I. The common line L is connected to the other terminal of the control input I.

One of the pair of output terminals at II is connected to the emitter of the transistor T3 and is connected additionally to the base of the transistor T3 and to the collector of the transistor T2 through ahmic resistor R2 and to the control electrode point G through an ohmic resistor R3. The other terminal at the output II is defined by the aforementioned common line L.

The circuit arrangement which is illustrated in the drawing is blocked when an input current is impressed into the transistor T1. Through this, said transistor T1 is put into a conducting condition so that the base of the transistor T2 is at the reference potential on line L and same is thus blocked. By blocking the transistor T2, the base of the transistor T3 is also practically at the potential of its emitter so that the transistor T3 is also blocked. In this condition, the sum of the collector-base residual currents of the two transistors T2 and T3 flow through the resistor R2 and thereby determine the value of the resistor R2 in a manner which will be described hereinbelow.

If now the condition which is reproduced by the current which is impressed at the input I is changed and the controlling current drops off so far that the transistor T1 is rendered nonconductive, a current will flow through the resistor R3 and the base-emitter path of the transistor T2. Through this the transistor T2 becomes conductive and effects a current flow through the base-emitter path of the transistor T3. This causes a collector current to flow in the transistor T3, which collector current is added to the base-emitter current of the transistor T2 and thus consequently has the effect of a positive regeneration (positive feedback).

The conduction operation of the circuit arrangement is explained in detail hereinafter in order to make more clear an operation which is independent from any operating voltage. The conduction voltage of the arrangement occurs when a nonconductive condition exists on the transistor T1

$$V_w = V_{BE2} + \frac{V_{BE3}}{B2} \cdot \frac{R3}{R2} \quad (1)$$

The saturation voltage $V_{sat}$ of the circuit arrangement can be stated for the blocked or nonconductive condition of the transistor T1 in the following manner:

$$V_{sat} = V_{BE2} + V_{CE3sat} \quad (2)$$

From these relationships one can see that the conduction voltage can be kept very small through a suitable dimensioning of the resistors R2 and R3. The conduction voltage can be adjusted in such a manner that it corresponds with a very high ohmic resistor R3 practically to the saturation voltage $V_{sat}$ of the entire circuit at the switched current.

To further explain this behavior, a numerical example will be given hereinafter. It is assumed that the output terminals II of the circuit arrangement is connected to a signal line which represents a resistor of 100 ohms at a voltage of 10 volts. The current which must be switched is then 100 mA. In order to find the saturation voltage of the circuit, it must be assumed that the current which is to be switched flows through the base-emitter paths of the transistors T2 and T3 and for this reason results in a high base-emitter voltage. For an exemplary value of the respective base-emitter voltage of 1 volt and the respective collector-emitter voltage of 0.2 volt, the saturation voltage is then $$V_{sat} = 1\ V + 0.2\ V = 1.2\ V \quad (3)$$

As has been described earlier, the resistor R2 is dimensioned corresponding to the sum of the maximum collector-base residual currents of the transistors T2 and T3 for the blocked or nonconductive condition of the circuit arrangement, because said currents flow in the blocked condition through the resistor R2. If each of the current values, for example, is 0.05 mA and a voltage drop at the resistor R2, for example, is 0.2 volts and is still sufficient for blocking of the transistor T3, then a resistance value of 2 kiloohms is obtained for the resistor R2.

If during the transition into the conducting condition, the base-emitter voltage of the transistor T3 is for example 0.7 volts, the transistor T2 must, in this condition, conduct a collector current which is calculated from the mentioned voltage and the resistor R2 for the assumed example with 0.35 mA. The corresponding base current has then at a current amplification of this transistor T2 of B = 20 a value of 0.02 mA.

If the conduction voltage of the circuit arrangement is equal to the saturation voltage, the resistor R3 must be dimensioned such that at the voltage difference $V_{sat} - V_{BE2}$ a current of 0.02 mA flows therethrough. When the base-emitter voltage of the transistor T2 has at the earlier assumed current of 0.35 mA a value of 0.6 volts, then the resistor R3 is calculated to 30 kiloohms.

From this one can see that the inner resistance for the blocked condition, which inner resistance appears at the output terminals II of the circuit arrangement, has a value of 30 kiloohms and is therefore very highly ohmic compared with the resistance of the line which is to be switched, which resistance was assumed to be 100 ohms.

The connection of also several circuit arrangements of the aforedescribed type to a signal line is therefore not connected to influence the potential condition produced on this line. If one of the connected circuit arrangements is conductive due to a condition change at its input, then the signal line reaches a defined condition which corresponds practically to the line voltage 0 volt, whereby this condition is maintained independently from the number of conductive circuit arrangements until all units which are connected to the signal line are again nonconductive.

The embodiments of the invention in which an exclusive property or privilege is claimed are defined as follows:

1. A circuit arrangement for transferring a logic condition, comprising:
   means defining a pair of input terminals and means defining a pair of output terminals, one of said input terminals being connected by a common line to one of said output terminals;
   first semiconductor switching means having a means defining a first current path therethrough, said first current path being connected between said pair of output terminals;
   a first control electrode and a second control electrode for said first semiconductor switching means;
   second semiconductor switching means having a third control electrode connected to one of said input terminals remote from said common line, means defining a second current path through said second semiconductor switching means, said second current path being connected between said first control electrode and said common line, said third control electrode and said common line thereby defining said pair of input terminals;
   means for applying a reference potential to said common line; and
   control means for effecting a conduction of said first semiconductor switching means in response to a nonconduction of said second semiconductor switching means and a nonconduction of said first semiconducting switching means in response to a conduction of said second semiconductor switching means, said control means comprising first resistance means connected between said first control electrode and one of said output terminals separate from said common line and second resistance means connected between said second control electrode and said one of said output terminals separate from said common line whereby the impedence of said circuit arrangement across said pair of output terminals is controlled by a predefined change in signal input to said pair of input terminals to change the state of conduction of said second semiconductor switching means to cause said circuit arrangement to deliver a defined logic condition at said pair of output terminals.

2. A circuit arrangement according to claim 1, wherein said first semiconductor switching means consists of a first transistor having a first base, first emitter and first collector electrodes and a second transistor having a second base, second emitter and second collector electrodes, said first base electrode, defining said first control electrode, being connected to said second current path, one side of said first resistance means and said second collector electrode means, said first emitter electrode being connected to said common line, said first collector electrode being connected to said second base electrode, which defines said second control electrode, and one side of said second resistance means, said second emitter electrode being connected to said one of said output terminals separate from said common line and the opposite sides of said first and second resistance means.

3. A circuit arrangement according to claim 2, wherein said second semiconductor switching means consists of a third transistor having a third base, third emitter and third collector electrodes, said third collector electrode being connected to said first control electrode, said third emitter electrode being connected to said common line and said third base electrode being connected to said one of said input terminals remote from said common line.

4. A circuit arrangement for transferring a logic condition, comprising:
   means defining a pair of input terminals and means defining a pair of output terminals, one of said input terminals being connected by a common line to one of said output terminals;
   first semiconductor switching means having a means defining a first current path therethrough, said first current path being connected between said pair of output terminals;
   a first control electrode and a second control electrode for said first semiconductor switching means, said second control electrode being connected to one of said output terminals separate from said common line;
   second semiconductor switching means having a third control electrode connected to one of said input terminals remote from said common line, means defining a second current path through said second semiconductor switching means, said second current path being connected between said first control electrode and said common line, said third control electrode and said common line thereby defining said pair of input terminals;
   means for applying a reference potential to said common line; and
   first resistance means connected between said first control electrode and said one of said output terminals separate from said common line whereby the impedance of said circuit arrangement across said pair of output terminals is controlled by a predefined change in signal input to said pair of input terminals to change the state of conduction of said second semiconductor switching means to cause said circuit arrangement to deliver a defined logic condition at said pair of output terminals.

* * * * *